(12) United States Patent
Subramanian et al.

(10) Patent No.: US 7,325,207 B1
(45) Date of Patent: Jan. 29, 2008

(54) AUTOMATIC DEVICE STRENGTH BASED SENSITIZATION GENERATION FOR SEQUENTIAL ELEMENTS

(75) Inventors: Bhaskar Subramanian, Sunnyvale, CA (US); Manish Singh, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 462 days.

(21) Appl. No.: 11/007,942

(22) Filed: Dec. 9, 2004

(51) Int. Cl.
*G06F 17/50* (2006.01)
(52) U.S. Cl. .......................................... 716/4
(58) Field of Classification Search ............... None
See application file for complete search history.

(56) References Cited

U.S. PATENT DOCUMENTS

| | | | | |
|---|---|---|---|---|
| 5,191,541 | A | 3/1993 | Landman et al. | 364/489 |
| 5,636,130 | A | 6/1997 | Salem et al. | 364/488 |
| 5,649,165 | A * | 7/1997 | Jain et al. | 716/5 |
| 5,872,717 | A | 2/1999 | Yu et al. | 364/489 |
| 5,946,475 | A * | 8/1999 | Burks et al. | 716/6 |
| 6,301,691 | B1 * | 10/2001 | McBride | 716/5 |
| 6,567,944 | B1 | 5/2003 | Singh et al. | 714/727 |
| 6,707,721 | B2 | 3/2004 | Singh et al. | 365/189.05 |
| 6,952,812 | B2 * | 10/2005 | Abadir et al. | 716/4 |

OTHER PUBLICATIONS

"PathMill: Transistor-Level Static Timing Analysis," www.synopsys.com/products/analysis/pathmill_ds.html, printed Nov. 20, 2004, 5 pages.

* cited by examiner

*Primary Examiner*—Leigh M. Garbowski
(74) *Attorney, Agent, or Firm*—Dorsey & Whitney LLP

(57) ABSTRACT

The method and apparatus for analysis of integrated circuits using static timing analysis. For a circuit being analyzed, the value of the state net for the case of an undriven sensitization is resolved to a Hi/Lo logic on the output net and the sensitization is added to the appropriate pull-up/pull-down function on the output net. Furthermore, in the sensitization generation, the "present" state logic function at the output net is determined by the "previous" state variable of the sequential state net and the "present" state variables of the rest of the inputs to the sequential circuit. The "next" state logic function at the output net is determined by the "present" state variable of the sequential state net and the "next" state variables of the rest of the inputs to the sequential circuit. This variable is resolved as a function of "previous" state net variable and "present" state input net variables. In the present invention, a BDD XOR operation of the "present" state function and the "next" state function at the output net is used to determine the set of possible transitions at the output in terms of the transitions at the inputs. This function is further constrained with single input switching constraint. The resultant BDD describes the output net transition in terms of single input switching for every input to the sequential circuit.

14 Claims, 4 Drawing Sheets

AUTOMATIC DEVICE STRENGTH BASED SENSITIZATION GENERATION FOR SEQUENTIAL ELEMENTS

FIELD OF THE INVENTION

The present invention relates generally to the field of integrated circuit design and fabrication. More specifically, the present invention provides an improved method and apparatus for simulation and testing of integrated circuits and systems.

BACKGROUND OF THE INVENTION

With the constant increase in digital circuit complexity, multiple levels of abstraction in circuit representation are typically needed. Gate level and switch level representations are two other forms of circuit representations that are commonly used in simulation of the operation of integrated circuits. A gate level representation can be used to provide a schematic description of circuit components as interconnections of basic blocks having known Boolean functionalities. A switch level representation provides a representation of switches (transistors) and gates that implement the desired functionality for a particular circuit. For an integrated circuit to meet strict operating criteria in terms of speed, power, and surface area, it is generally necessary to create custom designs at the switch level. However, traditional techniques for verifying such designs are generally expensive and can incur errors.

Static timing analysis (STA) is one of the most popular methods for verifying the timing of synchronous circuits in an integrated circuit. To conduct a static timing analysis, it is necessary to provide a set of timing arcs with appropriate side input sensitizations. For doing static timing analysis, a set of timing arcs with appropriate side input sensitizations are needed. The timing arcs need to be generated automatically using MOS switch modeling and Boolean algebra. This can be accomplished by determining the pull-up and pull-down logic functions for the circuit output nets.

BDD based boolean algebra is used to determine the pull-up and pull-down functions. Each variable in the function is associated with a state. The state (on a net) can be one of the following: 1) previous, 2) present, or 3) next.

The function solve model for solving the output net pull-up and pull-down function assumes similar strength of devices. This results in cases where a pull-up path and a simultaneous pull-down path are assumed to lead to a contention. In case of dynamic circuits, however, this is not true. The feedback path devices are sized smaller than the devices in the feed-forward path. Therefore, the contention sensitizations need to be resolved to a logic value. Moreover, there is a need to remove the contention and undriven sensitizations from the net output by resolving the contention and undriven sensitizations.

SUMMARY OF INVENTION

The method and apparatus of the present invention provides an improvement in analyses of integrated circuits using static timing analysis. In the present invention, the value of the state net for the case of an undriven sensitization is resolved to a Hi/Lo logic on the output net and the sensitization is added to the appropriate pull-up/pull-down function on the output net. Furthermore, in the sensitization generation, the "present" state logic function at the output net is determined by the "previous" state variable of the sequential state net and the "present" state variables of the rest of the inputs to the sequential circuit. The "next" state logic function at the output net is determined by the "present" state variable of the sequential state net and the "next" state variables of the rest of the inputs to the sequential circuit. This variable is resolved as a function of "previous" state net variable and "present" state input net variables. In the present invention, a BDD XOR operation of the "present" state function and the "next" state function at the output net is used to determine the set of possible transitions at the output in terms of the transitions at the inputs. This function is further constrained with single input switching constraint. The resultant BDD describes the output net transition in terms of single input switching for every input to the sequential circuit.

The method and apparatus of the present invention is also operable to resolve contention sensitizations. For a contention sensitization, the actual resistance of the active path, e.g., to "vdd" from "fdyn" and the path to "gnd" from "fdyn," is computed. Whichever resistance is lesser is used as the actual sensitization.

The method and apparatus of the present invention offers a significant improvement over prior systems for analyzing the performance of dynamic circuits. Specifically, the present invention provides an automatic algorithmic approach to the determination of the correct set of sensitization arcs along with side input sensitizations for a dynamic circuit.

Other aspects and advantages of the invention will be apparent from the following description and the appended claims.

DETAILED DESCRIPTION

Figure 1:
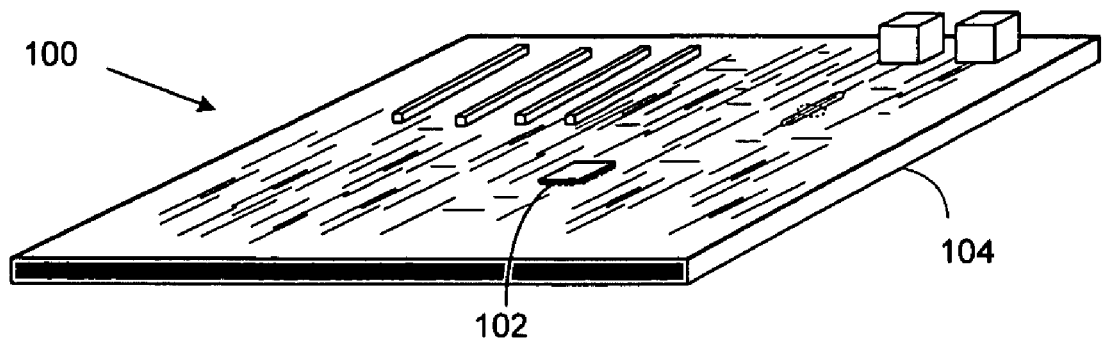
FIG. 1 is an illustration of an electronic system comprising a plurality of integrated circuit components fabricated in accordance with the method and apparatus of the present invention.
Figure 2:
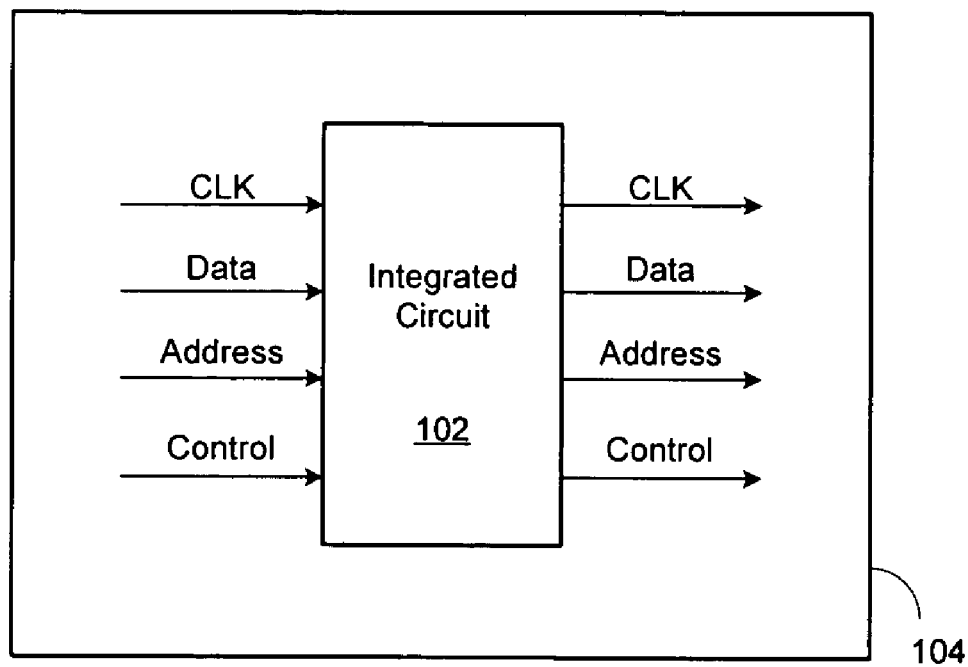
FIG. 2 is a block diagram of an integrated circuit illustrating a plurality of input and output signals.

FIG. 1 is an illustration of an electronic system 100 comprising a plurality of integrated circuit components fabricated in accordance with the method and apparatus of the present invention. A plurality of integrated circuits 102 are operably connected to a circuit board 104. FIG. 2 is a block diagram representation of the integrated circuit 102 illustrating a plurality of input and output signals. In order to ensure the proper operation of the integrated circuit 102, it is necessary to simulate the operation of the circuit using a simulation tool, such as Verilog® or a comparable simulation tool. As discussed hereinabove, as integrated circuits increase in complexity, multiple levels of abstraction in circuit representation are typically needed to verify proper operation of the circuits prior to fabrication. To accomplish this, a "netlist" is created for the various functional blocks within the integrated circuit. As will be understood by those of skill in the art, a "netlist" is a list of logic gates and their interconnections that make up a circuit. To create a netlist it is necessary to generate a code listing using an appropriate tool, such as Verilog® or a similar simulation tool for each of the functional blocks of the integrated circuit.

Figure 3A:
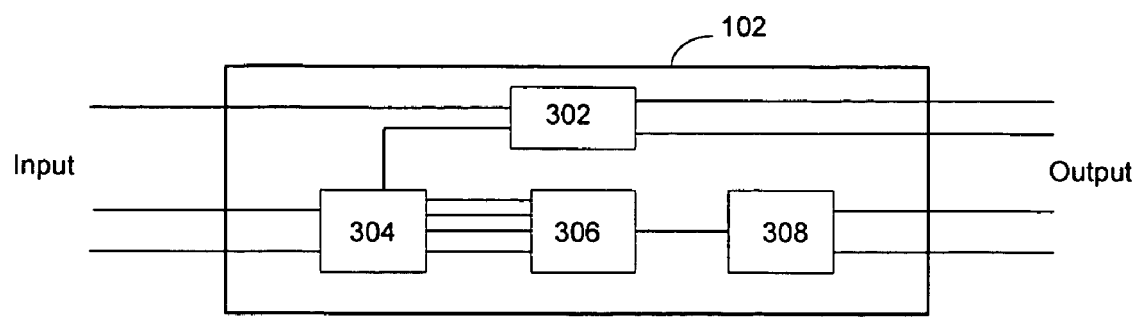
FIG. 3A is a block diagram of a plurality of system components of the integrated circuit shown in FIG. 2.

FIG. 3A is a conceptual block diagram illustrating a plurality of circuit modules 302, 304, 306 and 308 that are contained in the integrated circuit 102. While it is not necessary to describe the specific functions of the modules 302, 304, 306 and 308 with regard to the present invention, it will be understood by those of skill in the art that each of these modules contain logic circuits such as the "OR" gates 310, 312 and the "NAND" gate 314 illustrated in FIG. 3B. The operation of such logic circuits in each of the modules of integrated circuit 102 must be represented in an appropriate netlist code. Circuits such as those illustrated in FIGS. 3A and 3B can be analyzed using the method and apparatus of the present invention as discussed in greater detail hereinbelow.

Figure 3B:
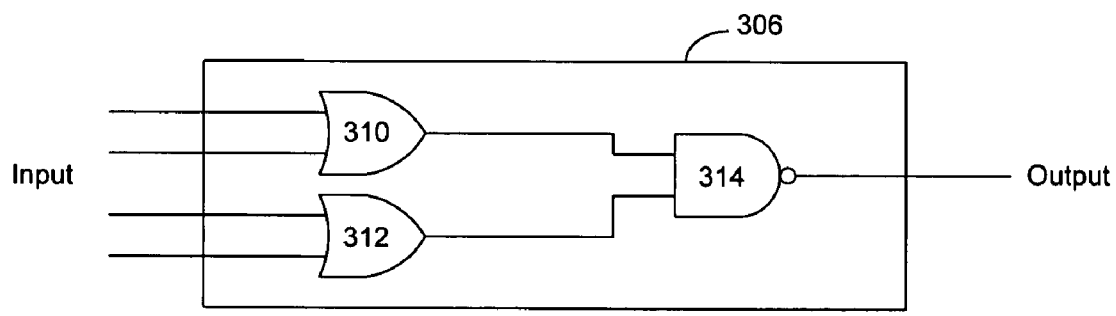
FIG. 3B is a block diagram of a plurality of logic components contained in one of the system component blocks illustrated in FIG. 3A.

The method and apparatus of the present invention provides an improvement in analyses of integrated circuit using static timing analysis to analyze circuits such as those illustrated in FIGS. 3A and 3B. As was discussed hereinabove, for static timing analysis of dynamic circuits, it is necessary to use a set of timing arcs with appropriate side input sensitizations. Moreover, it is desirable for the timing arcs to be generated using MOS switch modeling and to be verified using Boolean algebra. In the present invention, this is accomplished by determining the pull-up and pull-down logic functions for the circuit output nets. In an embodiment of the invention, BDD based boolean algebra is used to determine the pull-up and pull-down functions. Each variable in the function used in the present invention is associated with a state. The state (on a net) can be one of the following: 1) previous, 2) present, or 3) next.

As was discussed above, in prior systems, the function-solve model for solving the output net pull-up and pull-down function assumes similar strength of devices. This approach results in cases where a pull-up path and a simultaneous pull-down path are assumed to lead to a contention. In case of dynamic circuits, however, this is not true. The feedback path devices are sized smaller than the devices in the feed-forward path. The resulting output net can contain a plurality of intermediate sensitization state components comprised of contention sensitization components and undriven sensitization components. To obtain an accurate representation of the operation of the circuit components, it is necessary to resolve each of these categories of intermediate sensitization components. Specifically, there is a need to remove the contention and undriven sensitizations from the net output by resolving the contention and undriven sensitizations.

In the present invention, contention resolution is accomplished by using electrical analysis that computes impedances for pull-up and pull-down paths determined by the contention sensitization. The impedance of pull-up path is compared with the impedance of pull-down path. The lower impedance sensitization is added to the appropriate pull-up/pull-down function on the output net.

Sensitizations for which there are neither pull-up paths nor pull-down paths are termed as undriven sensitizations— implying a high impedance at the output. However, there is a stored logic value at the state net that drives the output net. The value of the state net in the case of undriven sensitization is resolved to a Hi/Lo logic on the output net and the sensitization is added to the appropriate pull-up/pull-down function on the output net.

The "present" state logic function at the output net is determined by the "previous" state variable of the sequential state net and the "present" state variables of the rest of the inputs to the sequential circuit. The "next" state logic function at the output net is determined by the "present" state variable of the sequential state net and the "next" state variables of the rest of the inputs to the sequential circuit. The variable representing the "present" state of the state net is not an independent variable. This variable is resolved as a function of "previous" state net variable and "present" state input net variables. A BDD XOR operation of the "present" state function and the "next" state function at the output net is used to determine the set of possible transitions at the output in terms of the transitions at the inputs. This function is further constrained with single input switching constraint. The resultant BDD describes the output net transition in terms of single input switching for every input to the sequential circuit.

Figure 4:
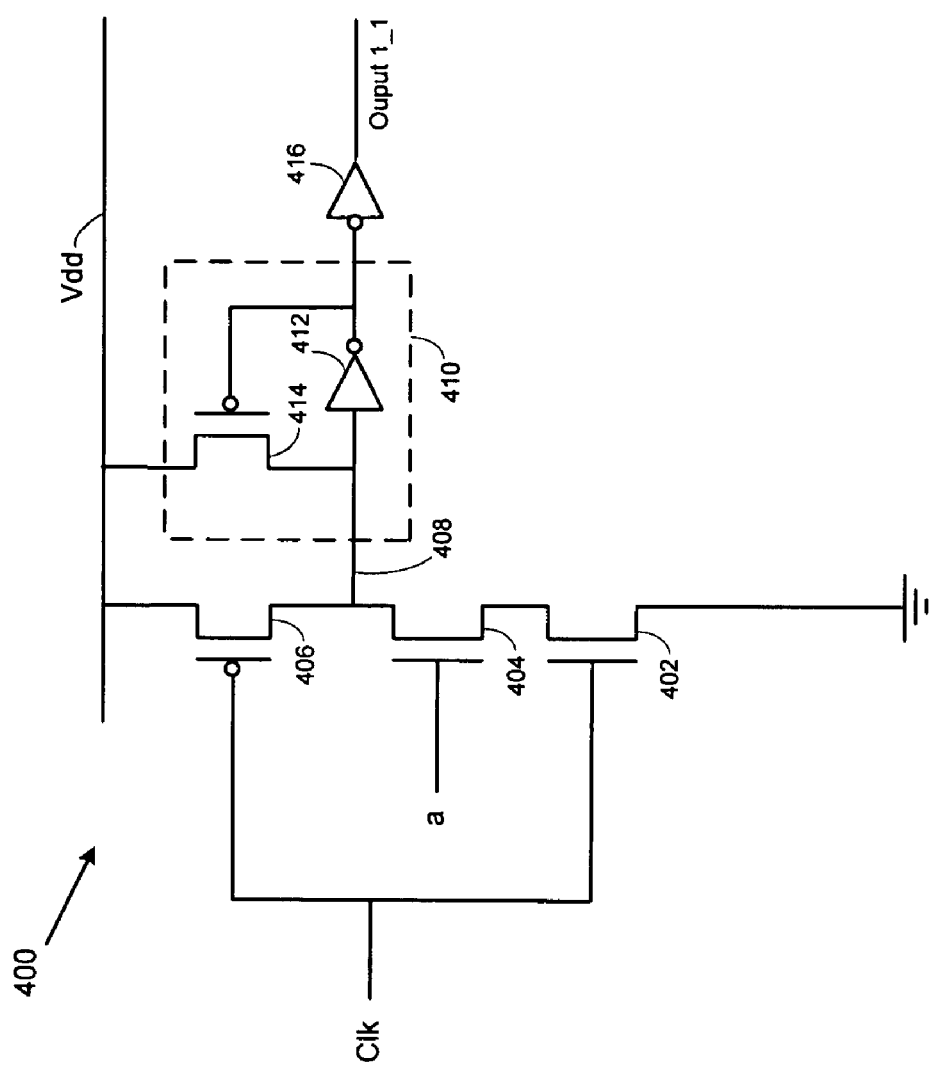
FIG. 4 is an illustration of an example of a single output circuit used in the present invention.

The aspects of the present invention can be better understood by referring to example circuits, such as FIG. 4, which depicts an example of a single output circuit 400 used in the present invention. The circuit comprises an evaluate device 402, a side-input device 404 and a precharge device 406. The "fdyn" output signal 408 is maintained by a feedback block 410 comprising an inverter 412 and a P-type transistor 414. The output of the feedback block 410 is provided to inverter 416 to generate output signal 1_1.

The following is a sequence of static timing analysis processing steps that can be implemented to determine the dynamic characteristics of the circuit 400 illustrated in FIG. 4.

{00:00:02}::STATUS::dash::sens Doing undriven term resolution at state net fdyn

{00:00:02}::STATUS::dash::sens Bdd.1 before undriven term resolution for state net fdyn: clk fdyn + !clk {00:00:02}::STATUS::dash::sens Bdd.0 before undriven term resolution for state net fdyn: clk a {00:00:02}::STATUS::dash::sens Bdd.1 after undriven term resolution for state net fdyn: clk fdyn + !clk {00:00:02}::STATUS::dash::sens Bdd.0 after undriven term resolution for state net fdyn: clk a + clk !a !fdyn {00:00:02}::STATUS::dash::sens Doing contention resolution at state net fdyn {00:00:02}::STATUS::dash::sens Bdd.1 before contention term resolution for state net fdyn: clk fdyn + !clk {00:00:02}::STATUS::dash::sens Bdd.0 before contention term resolution for state net fdyn: clk a + clk !a !fdyn {00:00:02}::STATUS::dash::sens Bdd.1 after contention term resolution for state net fdyn: clk !a fdyn + !clk {00:00:02}::STATUS::dash::sens Bdd.0 after contention term resolution for state net fdyn: clk a + clk !a !fdyn Logic at output node ("present" State Logic 1):clk a + clk !a !fdyn~

Logic at output node ("present" State Logic 0):clk !a fdyn~ + !clk

Logic at output node ("next" State Logic 1):clk a clk' + clk !a fdyn~ clk' a' + clk !a !fdyn~ clk' + !clk clk' a'

Logic at output node ("next" State Logic 0):clk a !clk' + clk !a fdyn~ clk' !a' + clk !a fdyn~ !clk' + clk !a !fdyn~ !clk' + !clk clk' !a' + !clk !clk'

Transition function for Rising Arcs (output Rising):clk !a fdyn~ clk' a' + !clk a clk' a'

Transition function for Falling Arcs (output Falling):clk a !clk' a' + clk !a !fdyn~ !clk' !a'

Table 1 is a listing of the vectors generated using the sequence of processing steps listed above for the dynamic circuit illustrated in FIG. 4.

TABLE 1

| <clk> | <a> | <fdyn~> | <out> |
|-------|-----|---------|-------|
| 1     | R   | 1       | R     |
| R     | 1   | —       | R     |
| F     | 1   | —       | F     |
| F     | 0   | 0       | F     |

The resolution of contentions using the method and apparatus of the present invention can be further understood by referring to Table 2. The first three columns of Table 2 correspond to the three inputs "clk," "a" and "fdyn~" (previous state fdyn) for the circuit shown in FIG. 4. The next two columns represent the output function as determined by the function-solve. In these columns, a "1" under "Hi" means there is a path from node "fdyn" to "vdd" and a "1" under "Lo" means there is a path from node "fdyn" to "gnd." If there is no "1" that means there is no path. Under the function-solve columns, it can be seen that for (clk=1, fdyn~=0, a=0) there is neither a path to "vdd" or "gnd" from "fdyn." This is the undriven case. Under the function-solve columns, it can be seen that for (clk=1, fdyn~=1, a=1) there is both a path to "vdd" and "gnd" from "fdyn." This represents a contention case.

Existence of the undriven and contention cases leads to some real timing arcs and sensitizations being missed for analysis and some false sensitizations and arcs coming into analysis. For instance, if the function-solve results below were used after removing the contention and undriven terms, the timing arc <a>=R<out>=R with side input sensitizations clk=1 and fdyn~=1 will be missed. Also the timing arc <clk>=F <out>=F with side input sensitizations fdyn~=0 and a=0 will be missed.

Therefore resolution of undriven and contention terms is needed for correct timing arc and side input sensitization generation.

TABLE 2

| Inputs | | | fn solve | | un-driven | | resolution | | contention | | resolution | |
|---|---|---|---|---|---|---|---|---|---|---|---|---|
| clk | fdyn~ | a | Hi | Lo | Hi | Lo | Hi | Lo | Hi | Lo | Hi | Lo |
| 0 | 0 | 0 | 1 | | | | 1 | | | | 1 | |
| 0 | 0 | 1 | 1 | | | | 1 | | | | 1 | |
| 0 | 1 | 0 | 1 | | | | 1 | | | | 1 | |
| 0 | 1 | 1 | 1 | | | | 1 | | | | 1 | |
| 1 | 0 | 0 | (undriven) | | | | | | | | 1 | 1 |
| 1 | 0 | 1 | | 1 | | | | | | | 1 | 1 |
| 1 | 1 | 0 | 1 | | | | 1 | | | | 1 | |
| 1 | 1 | 1 | 1 | 1 | | | 1 | | | | 1 | |
| | | | (cont) | | | | | | | | | |

The undriven sensitizations are resolved as follows: In an undriven case (where there is no path to gnd or vdd to fdyn), the previous logic at "fdyn" (as obtained from fdyn~) is set as current value of fdyn. Thus, the undriven sensitization is resolved.

The contention sensitizations are resolved as follows: For a contention sensitization, the actual resistance of the active path to vdd from "fdyn" and the path to "gnd" from "fdyn" is computed. Whichever resistance is lesser, that is the actual sensitization. For example in the above case for (clk=1 fdyn~=1 a=1), the resistance to "gnd" from "fdyn" is lesser than the resistance to "vdd" from "fdyn." So the contention for this sensitization is resolved as logic low.

Figure 5:
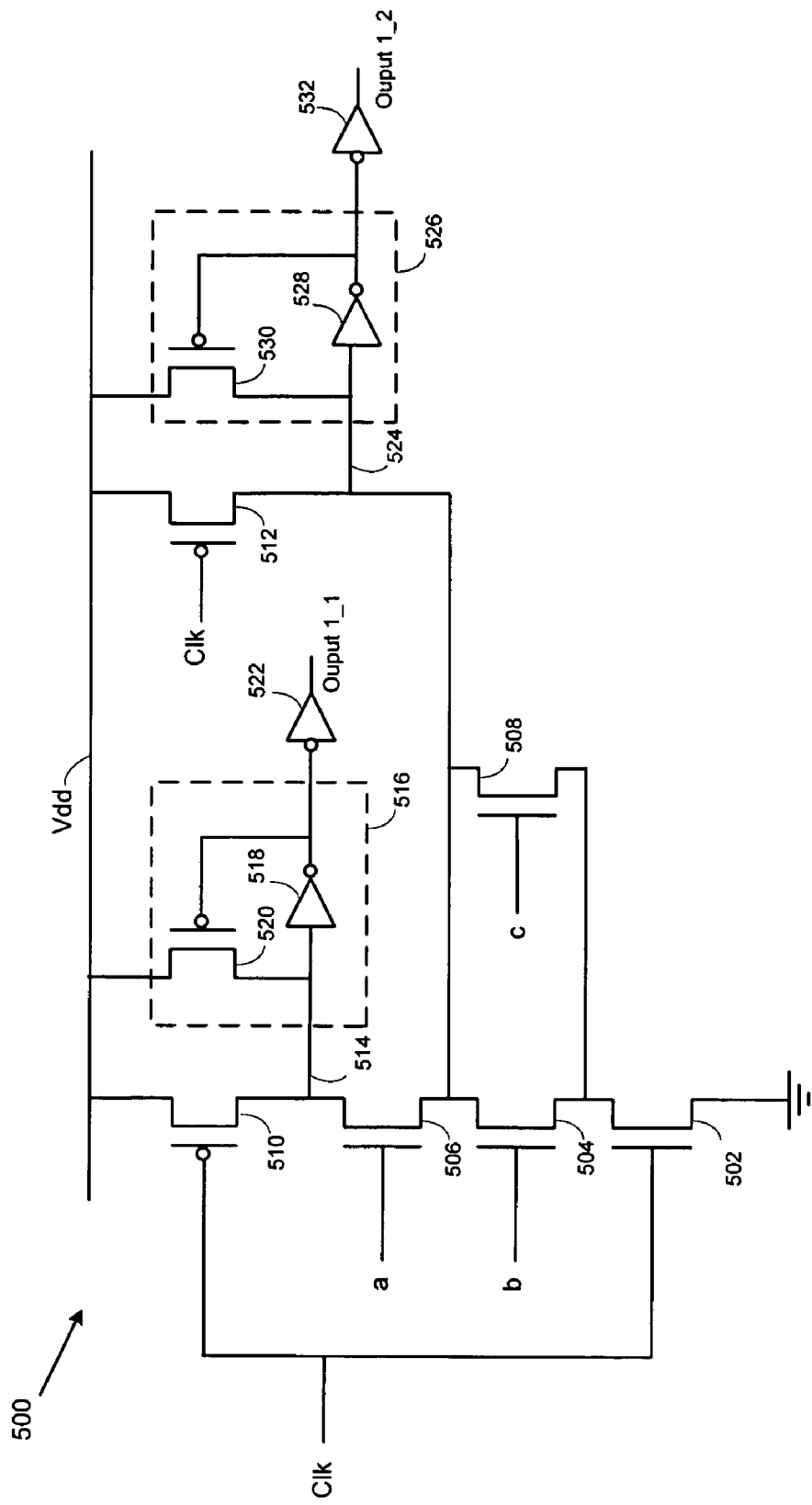
FIG. 5 is an illustration of a multi-output circuit used in the present invention.

FIG. 5 is an illustration of a multi-output dynamic circuit 500 used in one embodiment of the present invention. The circuit 500 comprises an evaluate device 502, side-input devices 504, 506 508, and precharge devices 510 and 512. The output signal 514 is maintained by a feedback block 516 comprising an inverter 518 and a P-type transistor 520. The output of the feedback block 516 is provided to inverter 522 to generate output signal 1_1. The output signal 524 is maintained by a feedback block 526 comprising an inverter 528 and a P-type transistor 530. The output of the feedback block 526 is provided to inverter 532 to generate output signal 1_2.

The following is a sequence of static timing analysis processing steps that can be implemented to determine the dynamic characteristics of the circuit 500 illustrated in FIG. 5.

{00:00:01}::STATUS::dash::sens Sequential DelayArc created

{00:00:01}::STATUS::dash::sens Doing undriven term resolution at state net ddh1

{00:00:01}::STATUS::dash::sens Bdd.1 before undriven term resolution for state net ddh1: clk in1 ddh1 + clk in1 !ddh1 ddh + clk !in1 ddh1 + !clk {00:00:01}::STATUS::dash::sens Bdd.0 before undriven term resolution for state net ddh1: clk in3 + clk !in3 in2

{00:00:01}::STATUS::dash::sens Bdd.1 after undriven term resolution for state net ddh1: clk in1 ddh1 + clk in1 !ddh1 ddh + clk !in1 ddh1 + !clk {00:00:01}::STATUS::dash::sens Bdd.0 after undriven term resolution for state net ddh1: clk in3 + clk !in3 in2 + clk !in3 !in2 in1 !ddh1 !ddh + clk !in3 !in2 !in1 !ddh1

{00:00:01}::STATUS::dash::sens Doing contention resolution at state net ddh1

{00:00:01}::STATUS::dash::sens Bdd.1 before contention term resolution for state net ddh1: clk in1 ddh1 + clk in1 !ddh1 ddh + clk !in1 ddh1 + !clk {00:00:01}::STATUS::dash::sens Bdd.0 before contention term resolution for state net ddh1: clk in3 + clk !in3 in2 + clk !in3 !in2 in1 !ddh1 !ddh + clk !in3 !in2 !in1 !ddh1

{00:00:02}::STATUS::dash::sens Bdd.1 after contention term resolution for state net ddh1: clk !in3 !in2 in1 ddh1 + clk !in3 !in2 in1 !ddh1 ddh + clk !in3 !in2 !in1 ddh1 + !clk {00:00:02}::STATUS::dash::sens Bdd.0 after contention term resolution for state net ddh1: clk in3 + clk !in3 in2 + clk !in3 !in2 in1 !ddh1 !ddh + clk !in3 !in2 !in1 !ddh1

Logic at output node ("present" State Logic 1):clk in3 + clk !in3 in2 + clk !in3 !in2 in1 !ddh1~ !ddh~ + clk !in3 !in2 !in1 !ddh1~

Logic at output node ("present" State Logic 0):clk !in3 !in2 in1 ddh1~ + clk !in3 !in2 in1 !ddh1~ ddh~ + clk !in3 !in2 !in1 ddh1~ + !clk Logic at output node ("next" State Logic 1):clk in3 in1 !ddh1~ !ddh~ clk' + clk in3 !in1 ddh~ clk' in3' + clk in3 !in1 ddh~ clk' !in3' in2' + clk in3 !in1 ddh~ clk' !in3' !in2' !in1' + clk !in3 in2 in1 !ddh1~ !ddh~ clk' + clk !in3 in2 !in1 ddh~ clk' in3' + clk !in3 in2 !in1 ddh~ clk' !in3' !in2' !in1' + clk !in3 in2 !in1 ddh~ clk' !in3' in2' + clk !in3 !in2 in1 ddh1~ clk' in3' + clk !in3 !in2 in1 !ddh1~ clk' !in3' in2' + clk !in3 !in2 in1 !ddh1~ ddh~ clk' !in3' + clk !in3 !in2 in1 !ddh1~ ddh~ clk' !in3' in2' + clk !in3 !in2 !in1 ddh1~ ddh~ clk' in3' + clk !in3 !in2 !in1 ddh1~ ddh~ clk' !in3' in2' + clk !in3 !in2 !in1 !ddh1~ ddh~ clk' in3' + clk !in3 !in2 !in1 !ddh1~ ddh~ clk' !in3' in2' + clk !in3 !in2 !in1 !ddh1~ ddh~ clk' !in3' !in2' !in1' + !clk clk' in3' + !clk clk' !in3' in2'

Logic at output node ("next" State Logic 0):clk in3 in1 !ddh1~ !ddh~ !clk' + clk in3 !in1 ddh~ clk' !in3' !in2' in1' + clk in3 !in1 ddh~ !clk' + clk !in3 in2 in1 !ddh1~ !ddh~ !clk' + clk !in3 in2 !in1 ddh~ clk' !in3' !in2' in1' + clk !in3 in2 !in1 ddh~ !clk' + clk !in3 !in2 in1 ddh1~ clk' !in3' !in2' + clk !in3 !in2 in1 ddh1~ !clk' + clk !in3 !in2 in1 !ddh1~ ddh~ clk' !in3' !in2' + clk !in3 !in2 in1 !ddh1~ ddh~ !clk' + clk !in3 !in2 !in1 ddh1~ ddh~ clk' !in3' !in2' + clk !in3 !in2 !in1 ddh1~ ddh~ !clk' + clk !in3 !in2 !in1 !ddh1~ ddh~ clk' !in3' !in2' in1' + clk !in3 !in2 !in1 !ddh1~ ddh~ !clk' + !clk clk' !in3' !in2' + !clk !clk'

Transition function for Rising Arcs (output Rising):clk !in3 !in2 in1 ddh1~ clk' in3' !in2' in1' + clk !in3 !in2 in1 ddh1~ clk' !in3' in2' in1' + clk !in3 !in2 in1 !ddh1~ ddh~ clk' in3' !in2' in1' + clk !in3 !in2 in1 !ddh1~ ddh~ clk' !in3' in2' in1 + clk !in3 !in2 in1 !ddh1~ ddh~ clk' !in3' in2' in1' + clk !in3 !in2 !in1 ddh1~ ddh~ clk' in3' in2' !in1' + clk !in3 !in2 !in1 ddh1~ ddh~ clk' !in3' in2' !in1' + !clk in3 in2 in1 clk' in3' in2' in1' + !clk in3 in2 !in1 clk' in3' in2' !in1' + !clk in3 !in2 in1 clk' in3' !in2' in1' + !clk in3 !in2 !in1 clk' in3' !in2' !in1' + !clk !in3 in2 in1 clk' !in3' in2' in1' + !clk !in3 in2 !in1 clk' !in3' in2' !in1'

Transition function for Falling Arcs (output Falling):clk in3 in2 in1 !ddh1~ !ddh~ !clk' in3' in2' in1' + clk in3 in2 !in1 ddh~ !clk' in3' in2' !in1' + clk !in3 in2 in1 !ddh1~ !ddh~ !clk' in3' !in2' in1' + clk in3 !in2 !in1 ddh~ !clk' in3' !in2' !in1' + clk !in3 in2 in1 !ddh1~ !ddh~ !clk' !in3' in2' in1' + clk !in3 in2 !in1 ddh~ !clk' !in3' in2' !in1' + clk !in3 !in2 !in1 !ddh1~ ddh~ clk' !in3' !in2' in1' + clk !in3 !in2 !in1 !ddh1~ ddh~ clk' !in3' in2' !in1'

Table 3 is a listing of the vectors generated using the sequence of processing steps listed above for the dynamic circuit illustrated in FIG. 5.

TABLE 3

| <Clk> | <in3> | <in2> | <in1> | <ddh1~> | <ddh~> | <x10_y> |
|---|---|---|---|---|---|---|
| 1 | R | 0 | 1 | 1 | — | R |
| 1 | R | 0 | 1 | 0 | 1 | R |
| 1 | R | 0 | 0 | 1 | 1 | R |
| 1 | 0 | R | 1 | 1 | — | R |
| 1 | 0 | R | 1 | 0 | 1 | R |
| 1 | 0 | R | 0 | 1 | 1 | R |
| R | 1 | 1 | 1 | — | — | R |
| R | 1 | 1 | 0 | — | — | R |
| R | 1 | 0 | 1 | — | — | R |
| R | 1 | 0 | 0 | — | — | R |
| R | 0 | 1 | 1 | — | — | R |
| R | 0 | 1 | 0 | — | — | R |
| F | 1 | 1 | 1 | 0 | 0 | F |
| F | 1 | 1 | 0 | — | 1 | F |
| F | 1 | 0 | 1 | 0 | 0 | F |
| F | 1 | 0 | 0 | — | 1 | F |
| F | 0 | 1 | 1 | 0 | 0 | F |
| F | 0 | 1 | 0 | — | 1 | F |
| F | 0 | 0 | 0 | 0 | 1 | F |
| 1 | 0 | 0 | R | 0 | 1 | F |

The method and apparatus of the present invention offers a significant improvement over prior systems for analyzing the performance of dynamic circuits. Specifically, the present invention provides an automatic algorithmic approach to the determination of the correct set of sensitization arcs along with side input sensitizations for a dynamic circuit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A method for verifying operation of circuit components in an integrated circuit, comprising:
   generating a plurality of timing analysis signals corresponding to the operation of components in said integrated circuit;
   obtaining an output net list data set corresponding to the pull-up and pull-down characteristics of said components in said integrated circuit, said output net list data set containing a plurality of intermediate sensitization state components; and
   removing said intermediate sensitization state components of said output net list data set, thereby generating an output net list corresponding to the operation of said components of said integrated circuit.

2. The method of claim 1, wherein said plurality of timing analysis signals comprise side input sensitizations.

3. The method of claim 1, wherein said intermediate sensitization state components comprise contention sensitization components.

4. The method of claim 3, wherein said contention sensitization component of said output net list data set is resolved by:
   computing the impedance of all pull-up and pull-down paths of said circuit;
   comparing the impedance of said pull-up paths and said pull-down paths; and
   adding the lower impedance of said pull-up and pull-down paths to the respective corresponding paths in the output net list data set.

5. The method of claim 1, wherein said intermediate sensitization state components comprise undriven sensitization components.

6. The method of claim 5, wherein said undriven sensitization components of said output net list data are resolved by obtaining a stored logic value corresponding to said undriven sensitization and resolving said logic value to a Hi/Lo logic value on the output net list data set and adding the sensitization to a corresponding pull-up/pull-down function on the output net list.

7. The method of claim 6, wherein said undriven sensitization component is resolved by determining the previous, present, and next state of a sequential state net.

8. An integrated circuit, comprising:
   a plurality of circuit components for processing data signals in accordance with a timing sequence controlled by at least one clock signal and at least one data input signal;
   wherein operation of said integrated circuit is verified by:
      generating a plurality of timing analysis signals corresponding to the operation of components in said integrated circuit;
      obtaining an output net list data set corresponding to the pull-up and pull-down characteristics of said components in said integrated circuit, said output net list data set containing a plurality of intermediate sensitization state components; and
      removing said intermediate sensitization state components of said output net list data set, thereby generating an output net list corresponding to the operation of said components of said integrated circuit.

9. The integrated circuit of claim 8, wherein said plurality of timing analysis signals comprise side input sensitizations.

10. The integrated circuit of claim 8, wherein said intermediate sensitization state components comprise contention sensitization components.

11. The integrated circuit of claim 10, wherein said contention sensitization component of said output net list data set is resolved by:
   computing the impedance of all pull-up and pull-down paths of said circuit; comparing the impedance of said pull-up paths and said pull-down paths; and
   adding the lower impedance of said pull-up and pull-down paths to the respective corresponding paths in the output net list data set.

12. The integrated circuit of claim 8, wherein said intermediate sensitization state components comprise undriven sensitization components.

13. The integrated circuit of claim 12, wherein said undriven sensitization components of said output net list data are resolved by obtaining a stored logic value corresponding to said undriven sensitization and resolving said logic value to a Hi/Lo logic value on the output net list data set and adding the sensitization to a corresponding pull-up/pull-down function on the output net list.

14. The integrated circuit of claim 13, wherein said undriven sensitization component is resolved by determining the previous, present, and next state of a sequential state net.

* * * * *